(12) United States Patent
Wu

(10) Patent No.: US 6,255,167 B1
(45) Date of Patent: Jul. 3, 2001

(54) METHOD OF FORMING HIGH DENSITY BURIED BIT LINE FLASH EEPROM MEMORY CELL WITH A SHALLOW TRENCH FLOATING GATE

(75) Inventor: Shye-Lin Wu, Hsinchu (TW)

(73) Assignee: Texas Instruments - Acer Incorporated, Hsinchu (TW)

( * ) Notice: Subject to any disclaimer, the term of this patent is extended or adjusted under 35 U.S.C. 154(b) by 0 days.

(21) Appl. No.: 09/325,810

(22) Filed: Jun. 4, 1999

Related U.S. Application Data

(63) Continuation-in-part of application No. 09/089,897, filed on Jun. 3, 1998.

(51) Int. Cl.[7] .................................................. H01L 21/336
(52) U.S. Cl. ............................................................ 438/259
(58) Field of Search .................................... 438/221, 222, 438/257, 259, 262, 270, 296, 280, 261, 265, 263

(56) References Cited

U.S. PATENT DOCUMENTS

| | | | |
|---|---|---|---|
| 5,495,441 | * | 2/1996 | Hong ...................................... 365/185 |
| 5,529,943 | * | 6/1996 | Hong et al. ............................ 438/265 |
| 5,635,415 | * | 6/1997 | Hong ...................................... 438/261 |
| 6,048,765 | * | 4/2000 | Wu ......................................... 438/257 |

* cited by examiner

Primary Examiner—David Nelms
Assistant Examiner—David Nhu

(57) ABSTRACT

A method of fabricating buried bit line flash EEROM cells with shallow trench floating gates for suppressing the short channel effect is disclosed. The method includes the following steps. First, a first polysilicon layer with conductive impurities and a nitride capping layer are sequentially formed on a silicon substrate. The nitride cap layer serves as an anti-reflection coating (ARC) layer for improving the resolution of lithography. Then a photo-mask pattern on the ARC layer is formed to define trench regions, an anisotropic etching is performed to etch away unmasked portions of the nitride cap layer through the first polysilicon layer and slightly recess the silicon substrate using the patterned mask as a mask. After removing the patterned mask, a thermal annealed process is performed to grow a polyoxide layer on the sidewall of the first polysilicon layer and an thin oxynitride layer on the surface of the recessed silicon substrate. In the meantime, the buried bit lines are formed where each bit line is a layer beneath the first polysilicon layer. The trenches are then refilled with a silicon layer. A planarization process then follows. Subsequently, an interpoly dielectric layer is formed. Finally, a second polysilicon layer is formed and pattered to define word lines.

13 Claims, 6 Drawing Sheets

METHOD OF FORMING HIGH DENSITY BURIED BIT LINE FLASH EEPROM MEMORY CELL WITH A SHALLOW TRENCH FLOATING GATE

CROSS-REFERENCE TO RELATED APPLICATIONS

The invention is a continuation-in-part of the application filed on Jun. 3, 1998, with an application Ser. No. 09/089,897, under the same title assigned to same assignee.

FIELD OF THE INVENTION

The present invention relates to a semiconductor memory process, and more specifically, to a structure of high-density buried bit line flash EEPROM memory cells with a shallow trench-floating gate.

BACKGROUND OF THE INVENTION

In recent years, the development of portable telecommunications and laptop computers has become a major driving force in the design and technology of semiconductor ICs. This growing market requires low power, high-density and electrically rewritable nonvolatile memories. Electrically erasable programmable read only memories (EEPROM) are electrically erased on a byte-by-byte basis is one choice. However, the cell size of this memory is too large for application, and thus the flash memory is another choice because of its small size and highly reliability.

For achieving a high density memory device, Kazerounian et al., introduced a virtual ground concept using alternative metal virtual ground (AMG) to fabricate EPROM in the paper by R. Kazerounian, et al., titled "Alternate Metal Virtual Ground EPROM Array Implemented in a 0.8 $\mu$m Process for Very High Density Applications", IEDM Tech. Dig., p. 311, 1991. The synoptic layout and cross-sectional of this memory array are shown in FIGS. 1a–1b, The front end of the process is a standard n-well CMOS process. After LOCOS field oxidation and the EPROM gate a layer of the polysilicon 10 is deposited, and an ONO dielectric layer 15 is then formed on the top of the polysilicon 10. The ONO 15/poly-Si 10 is then patterned in elongated strips across each segment. Subsequently, a self-aligned arsenic implant form bit lines 20. An oxidation process combined with the CMOS gate oxidation process is done to form a gate oxide and to grow a bit line oxide. The process continues with doped polysilicon 25 and tungsten silicide 35 deposition. A self-aligned stack gate etch process is employed to define word line 25 and floating gate cell 40. The advantages of this array are the reduction of drain turn-on induced punch-through and the allowance of scaling of effective channel length to as low as 0.25 $\mu$m.

Later, the virtual ground concept then was applied to manufacture low voltage NOR virtual ground power flash memories by Bergemont, et al., to develop a flash memory with a fast access time. This is disclosed in the reference by A. Bergemont, et al., "Low voltage NVGTM: A New High Performance 3 V/5 V Flash Technology for Portable Computing and Telecommunications Applications", IEEE Trans. Electron Devices, ED43, p. 1510, 1996. The architecture of NVGTM is similar to AMG EPROM having a feature where one metal bit-line is shared between two columns of cells. These metal bit-lines are stripped to every other diffusion bit-line (stripped, continuous bit lines) through the selected transistors.

SUMMARY OF THE INVENTION

The foregoing prior art demonstrate some problems, such as the punch-through issue or the narrow space between the adjacent bit lines and the short channel effect. Thus in the present invention, a method of fabricating buried bit line flash EEROM cells using recessed silicon trench floating gates for suppressing the short channel effect is disclosed. The method comprises the following steps. First, a doped polysilicon layer with conductive impurities, such as phosphorus with concentrations of about $5 \times 10^{10} - 5 \times 10^{21}/cm^3$, is formed on the silicon substrate. Then, an anti-reflection coating (ARC) layer is formed on the doped polysilicon layer to improve the lithographic resolution. After coating a patterned mask on the ARC layer to define a plurality of buried bit line regions, a dry etch is performed to etch the unmasked regions till the silicon substrate is slightly recessed to form shallow trenches of about 50–600 nm in depth. Subsequently, the photoresist is stripped, and a gate dielectric layer is formed of a oxynitride layer of about 3–25 nm in thickness is thermal grown on the surface of the recessed silicon substrate. In the meantime, a poly-oxide layer on the sidewall of the doped polysilicon layer is formed. In addition, the buried bit lines are also formed where the bit lines include the remaining doped polysilicon layer and the layer beneath it due to the impurities driving in. After refilling a plurality of trenches with an in-situ doped silicon layer, a planarization process such as CMP is done to form a plain surface using the ARC layer as an etching stop layer. A stacked ONO layer of about 5–30 nm is then deposited as an interpoly dielectric layer. Finally another n+doped polysilicon layer is formed and patterned to form the word lines.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method of fabricating high density buried bit line flash EEROM with a floating gate in a trench of silicon substrate to prevent the short-channel effect is disclosed. The detailed processes are best illustrated by reference to the drawings, and are described as follows.

Figure 1A:
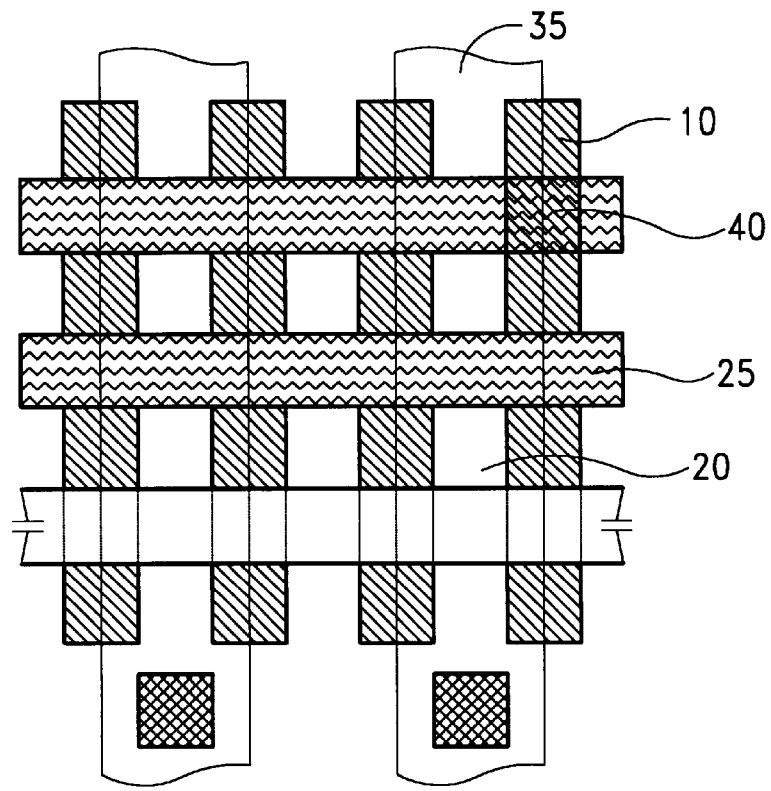
FIG. 1. is a synoptic layout of an EPROM array (FIG. 1a), and a cross-sectional view of an EPROM array (FIG. 1b) in accordance with the prior art.
Figure 1B:
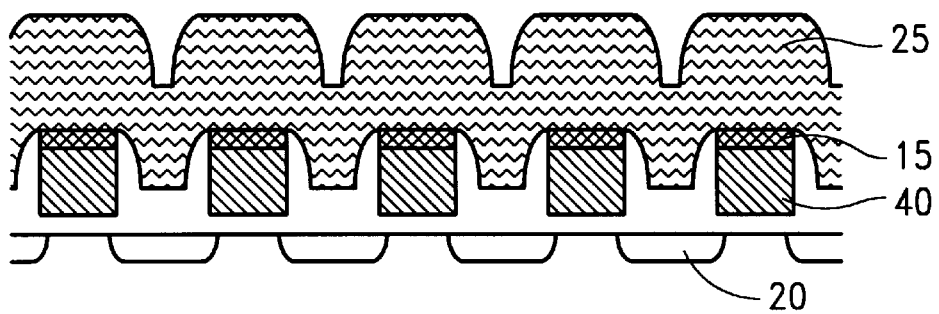
Figure 2:
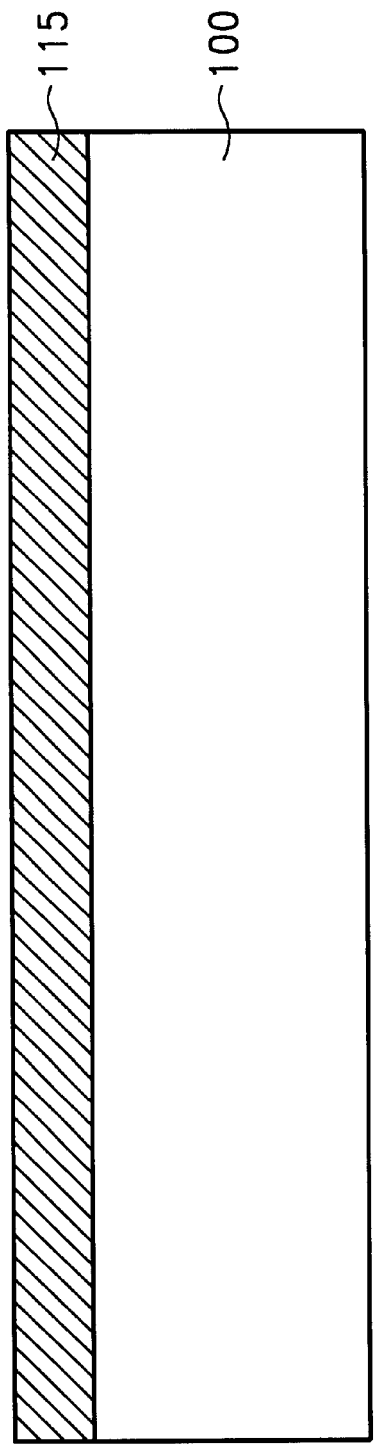
FIG. 2. is a cross-sectional view of formating a doped polysilicon layer on the silicon substrate layer in accordance with the present invention.

Referring to FIG. 2, a doped polysilicon layer 115 is deposited on a silicon substrate 100. In a preferred embodiment, the doped polysilicon layer 115 is formed to a thickness of about 10–100 nm by an in-situ doped LPCVD process at a temperature of about 400–625° C. The doping method can also be achieved by another method such as a pocl doped or by ion implant. In a pocl process, a phosphorus contains liquid ($POCl_3$) is utilized as a source, the vapor from the liquid sources reacts with oxygen to form doped oxides on the polysilicon layer, The equation is as follows:

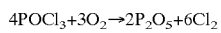

Figure 3:
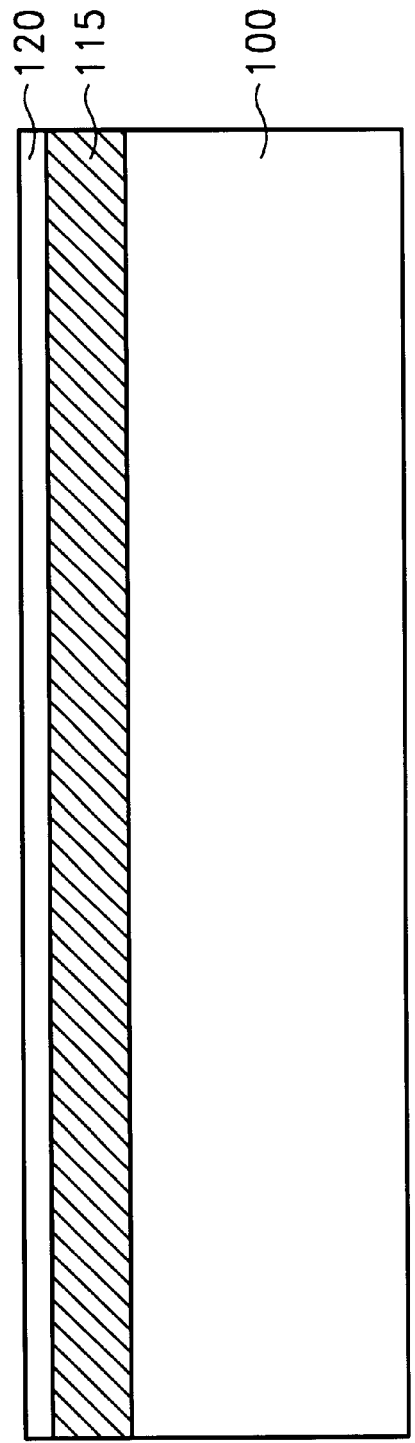
FIG. 3. is a cross-sectional view of an ARC layer formed atop the doped polysilicon layer in accordance with the present invention.

Preferably, the doping concentration is about $5 \times 10^{19} – 5 \times 10^{21}/cm^3$, and the thickness of polysilicon layer 115 is about 10–100 nm. After that, as shown in the FIG. 3, a thin cap nitride layer 120 to a thickness of about 10–50 nm is deposited on the n+doped polysilicon layer 115 by LPCVD method. The nitride cap layer 120 serves as an anti-reflection coating (ARC) layer so as to improve the lithography resolution for increasing the integrity of the chip and alleviating the misalignment.

Figure 4:
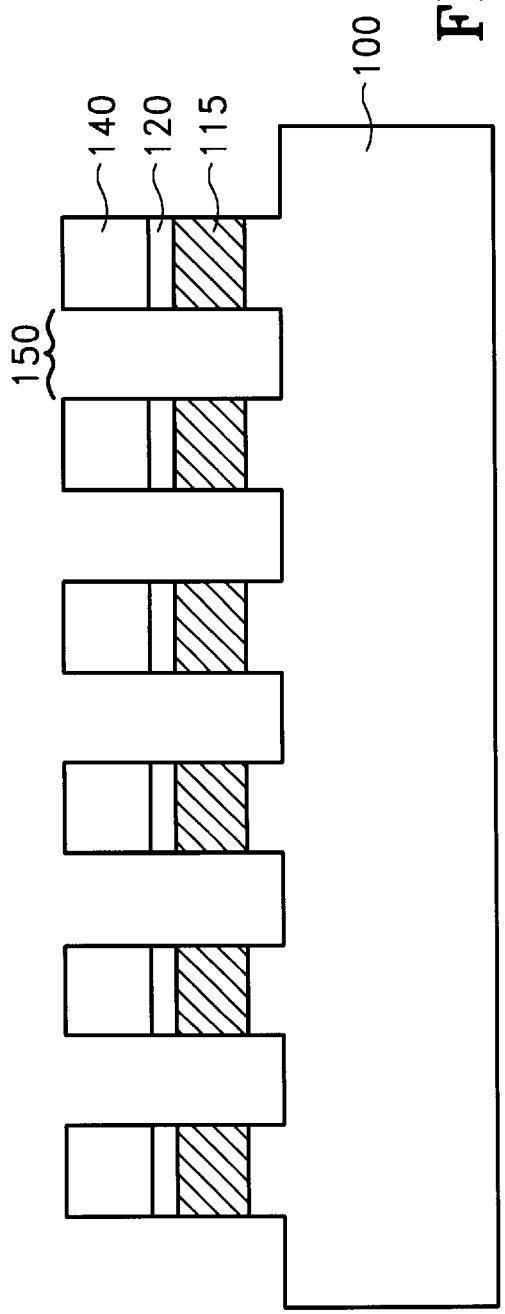
FIG. 4. is a cross-sectional view of defining a plurality of floating regions by patterning the ARC layer and the polysilicon layer and, slightly recessing the silicon substrate in accordance with the present invention.

As shown in FIG. 4, a patterned photoresist 140 is masked on the nitride capping layer 120 to define the floating gate regions, and then etching steps are performed. A dry etching is performed to remove successively the unmask portion of the nitride capping layer 120 n+ doped polysilicon layer 115 and to slightly recesses the silicon substrate 100 to form a plurality of shallow trenches 150 for suppressing the short channel effect. The recessed silicon trenches have a depth of about 3–100 nm, which is measured from the bottom of the trench to the upper surface of the silicon substrate 100. It was reported in the paper by P.H. Bricout, et al., "Short-Channel Effect Immunity and Current Capability of Sub-0.1-Micron MOSFET's Using a Recessed Channel", IEEE Trans. Electron Devices, ED-43, p. 1251, 1996. In this paper, a comparison of suppressing short channel effect between the planar MOSFET and the recessed channel MOSFET was investigated using both drift-diffusion and Monte Carlo simulation. The threshold voltage roll-off (e.g., threshold voltage roll-off increases the off current level and power dissipation) is clearly presented for the planar device, however, the recessed structure nearly keeps the same threshold voltage for all simulated channel lengths and for any gate oxide thickness. In addition, for the device is shorter than 50 nm, only a slow increase of the threshold swing is obtained in the recessed MOSFET's device.

Figure 5:
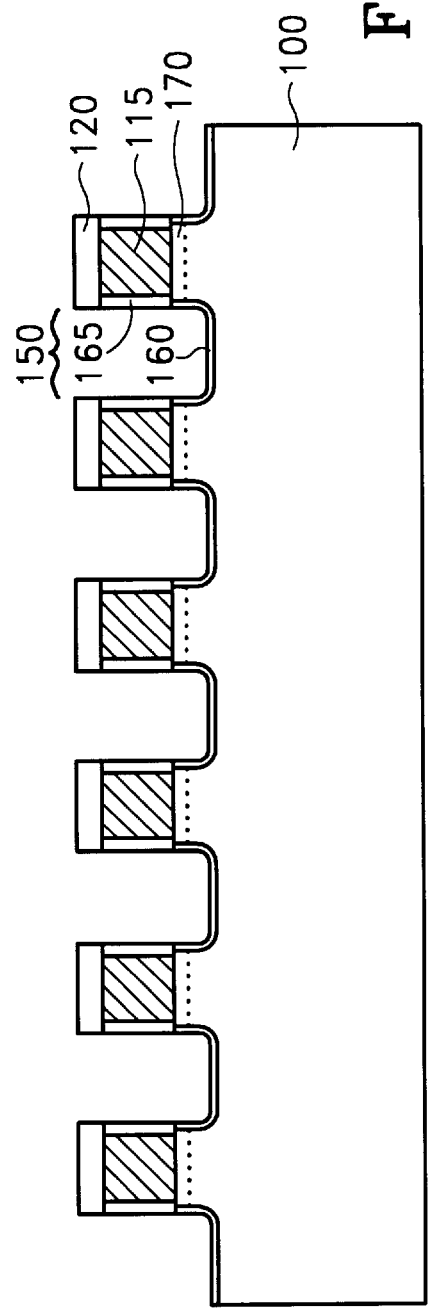
FIG. 5. is a cross-sectional view of growing an oxynitride layer and an polyoxide layer on the surfaces of the recessed silicon layer and the sidewalls of the doped polysilicon layer, respectively, in accordance with the present invention.

Referring to FIG. 5, an ultra-thin conformal gate dielectric layer 160 grown on the recessed surface of the silicon substrate 100 and a polyoxide 165 grown on the sidewall of the doped polysilicon layer 115 are carried out to respective thicknesses of about 3–20 nm and 6–50 nm. Concurrently, a plurality of conductive layers 170 underlying the remnant portions of the polysilicon layer 115 is formed being served as the buried bit lines 170 by driving the conductive impurities into the silicon substrate 100. The ultra-thin conformal gate dielectric layer 160 is an oxynitride layer, which can be prepared by a thermal anneal at a temperature of about 700–1150° C. in $N_2O/O_2$ ambient. The oxynitride 160 can be used to recover the etching damage. As reported in the reference by S.Y. Ueng, et al., titled "Superior Damage-Immunity of Thin Oxides Thermally Grown on Reactive-Ion-Etched Silicon Surface in $N_2O$ Ambient", IEEE Trans. Electro Devices, ED41, p. 850, 1994, the $N_2O$-grown oxides can remedy the RIE-induced defects, and exhibit significantly stronger immunity to RIE-induced damages. In addition, the MOS capacitor (MOSC) with oxynitride as a gate dielectric layer shows a great improvement over those of MOSC with pure oxygen ambient grown dielectric in the leakage currents and breakage fields.

Figure 6A:
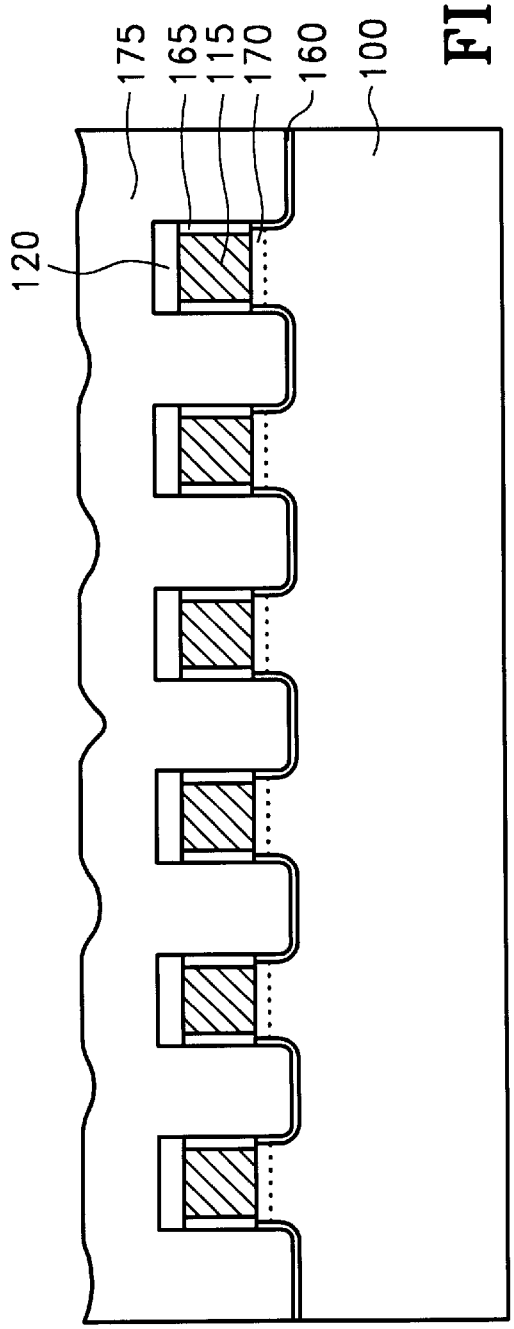
FIG. 6. is a cross-sectional view of refilling all trenches with n+doped polysilicon or $\alpha$-Si (FIG. 6a), and then performing planarization process (FIG. 6b) in accordance with the present invention.
Figure 6B:
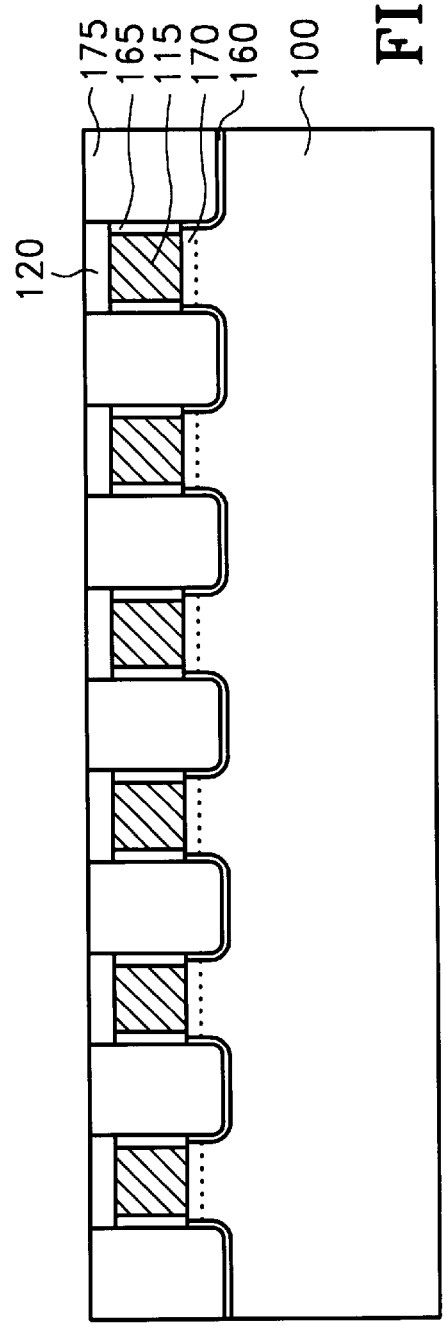

Referring to FIG. 6a, an in-situ n-type conductive impurity (n+doped) doped polysilicon layer or a doped amorphous silicon (α-Si) layer 175 is deposited to refill the shallow trenches 150. To deposit the α-Si layer 175, a method such as a LPCVD or a PECVD can be used (operated at temperature about 400–550° C. or 250–400° C., respectively). However, to deposit the polysilicon layer 175, a higher temperature process (operated at temperatures of about 580–650° C.) such as a LPCVD is required. The silicon layer selected relies on the trench width (for an example, to refill the trench for 0.1–0.2 µm width, α-Si is preferred, but for 0.25 µm feature size or above, the material can be formed of poly-Si or α-Si). In a preferred embodiment, in-situ phosphorus doped or arsenic doped Si is preferred, and the concentration is come up to about $5 \times 10^{19} – 5 \times 10^{21}$ $cm^3$. Thereafter, as shown in FIG. 6b a planarization process such as a chemical/mechanical polish (CMP) process using the gate dielectric layer 160 as a CMP stopping layer is achieved to form a flat surface. The n+doped polysilicon layer 175 serves as a floating gate of the flash memory.

Figure 7:
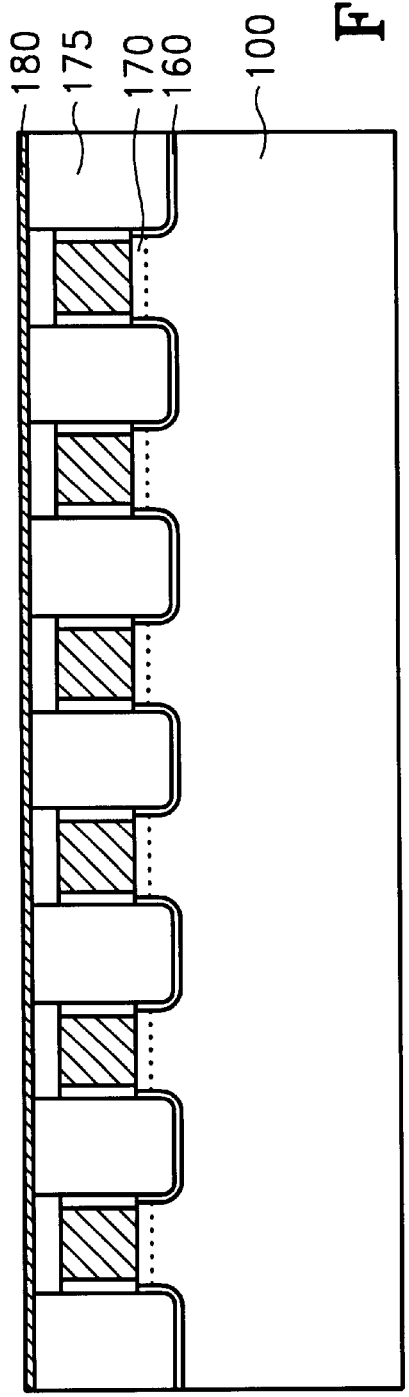
FIG. 7. is a cross-sectional view of forming a thin stacked ONO layer as an interpoly dielectric layer in accordance with the present invention.

Referring to FIG. 7, after the CMP process, a thin stacked ONO 180 is formed as the interpoly dielectric 180. Preferably, the "ONO" layer refers the nitride layer formed using LPCVD on a thermal oxide layer firstly, and then re-oxidation again to grow another oxide layer. The ONO layer has the properties of extremely dielectric integrity and long life time in breakdown characteristics. The thickness of upper oxide/nitride/ lower oxide of ONO 180 is, respectively, about 1–5 nm, 4–20 nm, and 1–5 mn.

Figure 8:
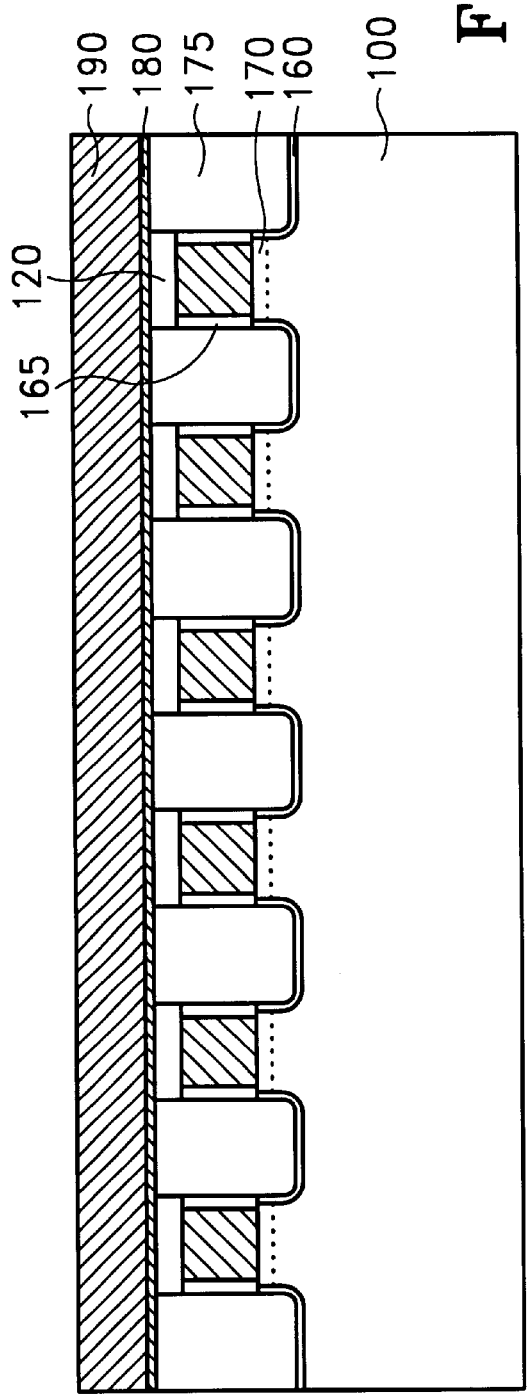
FIG. 8. is a cross-sectional view of depositing second n+polysilicon layer which is then patterned as word lines in accordance with present invention.

Next, referring to FIG. 8, another n+polysilicon layer 190 is deposited on all areas, and patterned to defined word lines. In a preferred embodiment, a CVD method, such as LPCVD is performed at a temperature of about 450–650° C., and the doping concentration is come up to about $5 \times 10^{19} – 5 \times 10^{21}$ /$cm^3$.

Figure 9:
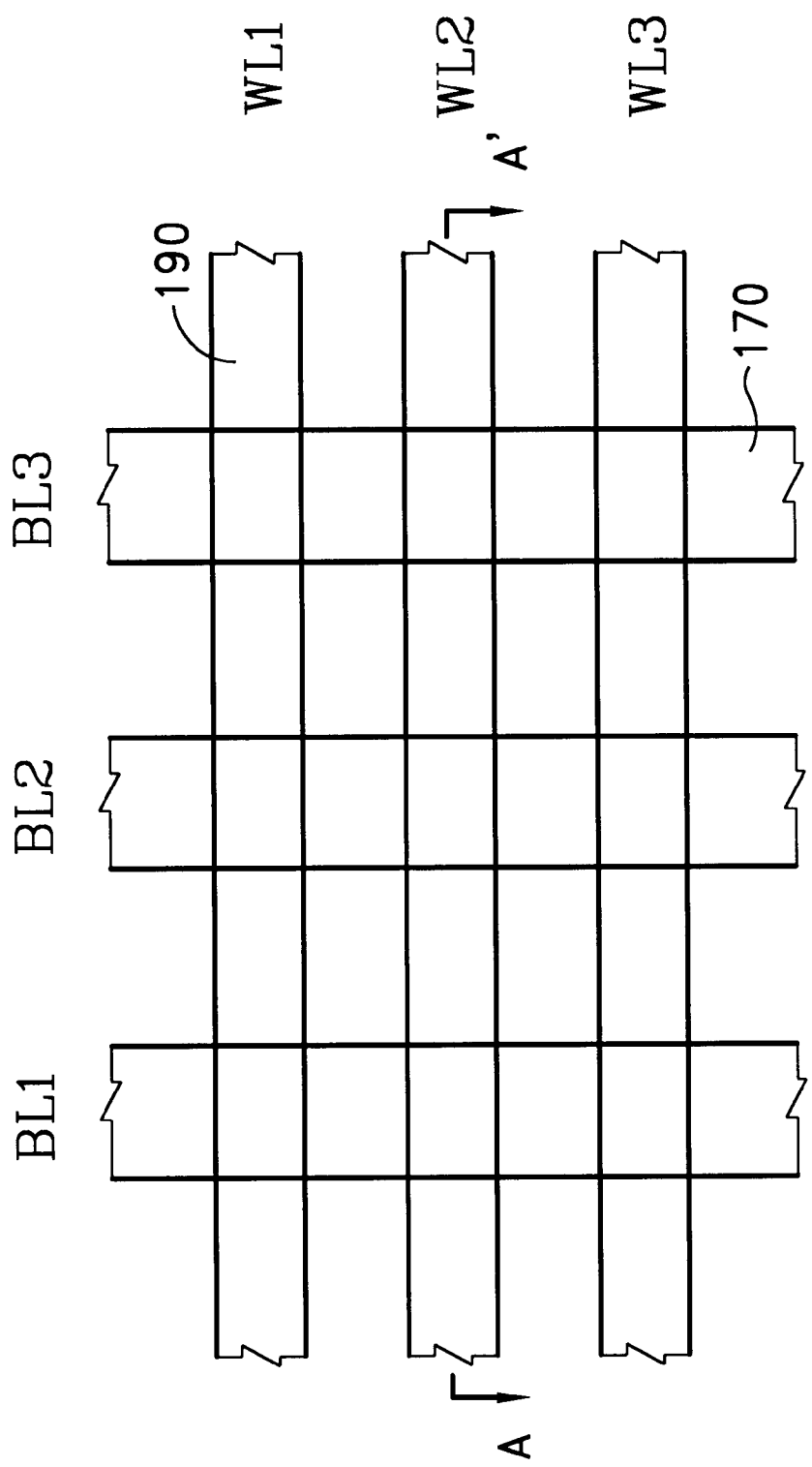
FIG. 9. is a top view of flash memory cells with buried bit lines and shallow trench floating gates in accordance with the present invention.

FIG. 9 is a top-view diagram illustrating the high-density contactless nonvolatile memory cells with buried bit lines and floating gates, respectively, underlying the polysilicon layer 115 and in the silicon trench regions 150, wherein the source/drain regions are bit lines 170, and the polysilicon gate 190 are word lines. FIGS. 2–8 are cross-sectional views of flash memories along the word line A—A', as depicted.

In conclusion, the benefits of this invention are:

(1) The high density and low power non-volatile memories can be achieved (due to cell structure with contactless array);

(2) the short channel effect can be suppressed due to the recessed silicon gate structure; and (3) the punchthrough problem between two narrow adjacent bit lines can be minimized.

As is understood by a person skilled in the art, the foregoing preferred embodiment of the present invention is an illustration of the present invention rather than a limitation thereon. It is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method of fabricating buried bit line flash EEPROM cells, each with a trench floating gate, comprising the step sequence of:

forming a first polysilicon layer with conductive impurities on a silicon substrate;

forming a nitride capping layer on said first polysilicon layer;

coating a patterned mask on said nitride capping layer to define a plurality of buried bit line regions, said nitride capping layer being serves as an antireflection coating layer;

forming a plurality of trenches by performing an anisotropic etching to etch away unmask portions of said nitride capping layer through said first polysilicon layer and, recessing said silicon substrate using said patterned mask as a mask;

removing said patterned masks;

concurrently thermal growing a polyoxide layer on each sidewall of said first polysilicon layer and a gate dielectric layer on each surface of said recessed silicon substrate and forming buried bit lines using said conductive impurities in remnant portions of said first polysilicon layer as a diffusion source;

forming a silicon layer to refill said plurality of trenches;

performing a planarization process to said silicon layer so as to form a plain surface using said nitride capping layer as an etching stopping layer;

forming an interpoly dielectric layer on all areas;

forming a second polysilicon layer on said interpoly dielectric layer; and forming word lines by patterning said second polysilicon layer.

2. The method of claim 1, wherein said step of forming a first polysilicon layer with conductive impurities is formed at a temperature of about 400–625° C. to about a thickness of about 10–100 nm.

3. The method of claim 1, wherein said first polysilicon layer is formed by a method selected from the group consisting of a in-situ doped CVD process, CVD process followed by a pocl doped process, and a CVD process followed by ion implant.

4. The method of claim 1, wherein said nitride capping layer is implemented at a temperature of about 400–800° C.

5. The method of claim 1, wherein said gate dielectric layer is an oxynitride layer with a thickness of about 2–30 nm formed.

6. The method of claim 1, wherein said step of concurrently thermal growing is done at a temperature about 700–1150° C. in an ambient $N_2O/NO$.

7. The method of claim 1, wherein said plurality of trenches are with a depth of about 3–100 nm each, said depth is measured from the upper surface of said silicon substrate to the bottom of said trench.

8. The method of claim 1, wherein said silicon layer comprises a material selected from the group consisting of amorphous silicon and polysilicon, and said silicon layer contains n-type impurities to concentrations of about $5\times10^{19}$–$5\times10^{21}/cm^3$.

9. The method of claim 1, wherein said steps of forming silicon layer is done at a temperature of about 450–650° C.

10. The method of claim 1, wherein said step of performing a planarization process is done by a CMP process.

11. The method of claim 1, wherein said interpoly dielectric layer is a stacked ONO layer, said ONO is with a second oxide layer over a nitride layer/first oxide layer to about 1–5 nm, 4–20 nm, and 1–5 nm, respectively.

12. The method of claim 1, wherein said step of forming polysilicon layer is performed by a LPCVD method at a temperature of about 450–650° C., and with n-type doping concentrations of about $5\times10^{19}$–$5\times10^{21}/cm^3$.

13. The method of claim 1, wherein said conductive impurities are selected from the group consisting of arsenic containing dopants and phosphorus containing dopants.

* * * * *